A solenoid health monitoring system uses a signal conditioner and controller assembly in one embodiment that includes analog circuitry and a DSP controller. The analog circuitry provides signal conditioning to the low-level raw signal coming from a signal acquisition assembly. Software running in a DSP analyzes the incoming data (recorded current signature) and determines the state of the solenoid whether it is energized, de-energized, or in a transitioning state. In one embodiment, the software identifies key features in the current signature during the transition phase and is able to determine the "health" of the solenoid.

(12) United States Patent
Perotti et al.

(10) Patent No.: US 6,917,203 B1
(45) Date of Patent: Jul. 12, 2005

(54) CURRENT SIGNATURE SENSOR

(75) Inventors: Jose M. Perotti, Merritt Island, FL (US); Angel Lucena, Orlando, FL (US); Curtis Ihlefeld, Orlando, FL (US); Bradley Burns, Orlando, FL (US); Mario Bassignani, deceased, late of Mims, FL (US); by Karin E. Bassignani, legal representative, Colorado Springs, CO (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 160 days.

(21) Appl. No.: 10/235,020

(22) Filed: Aug. 29, 2002

Related U.S. Application Data
(60) Provisional application No. 60/318,095, filed on Sep. 7, 2001.

(51) Int. Cl.[7] .............................................. G01R 31/00
(52) U.S. Cl. .................... 324/418; 324/546; 340/644
(58) Field of Search ................................ 324/418, 545, 324/546, 772, 158.1; 37/168, 862.68; 251/129.04, 129, 129.15; 702/57, 58; 340/635, 644; 73/168, 862.28

(56) References Cited

U.S. PATENT DOCUMENTS

| | | | |
|---|---|---|---|
| 4,542,649 A | * 9/1985 | Charbonneau et al. ......... 73/168 |
| 4,833,402 A | * 5/1989 | Boegh-Petersen ............ 324/754 |
| 4,870,364 A | * 9/1989 | Trox et al. ................... 324/418 |
| 4,953,056 A | 8/1990 | Yakuwa et al. |
| 5,053,911 A | 10/1991 | Kopec et al. |
| 5,153,522 A | * 10/1992 | Sano ........................... 324/546 |
| 5,196,983 A | 3/1993 | Stumpf |
| 5,241,218 A | 8/1993 | Page |
| 5,442,671 A | 8/1995 | Wollschlager et al. |
| 5,477,149 A | * 12/1995 | Spencer et al. ............. 324/418 |
| 5,548,210 A | 8/1996 | Dittrich |
| 5,668,476 A | 9/1997 | Archer |
| 5,784,245 A | 7/1998 | Moraghan et al. |
| 5,796,261 A | 8/1998 | Golab |
| 5,808,471 A | 9/1998 | Rooke et al. |
| 5,835,876 A | 11/1998 | Hathaway et al. |
| 5,847,274 A | 12/1998 | Schaffer |
| 5,861,746 A | * 1/1999 | Ensten ................... 324/207.16 |
| 5,986,871 A | 11/1999 | Forck et al. |
| 5,995,356 A | 11/1999 | Glavmo et al. |
| 5,995,916 A | 11/1999 | Nixon et al. |
| 6,006,163 A | 12/1999 | Lichtenwalner et al. |
| 6,111,514 A | 8/2000 | Cossins et al. |
| 6,119,515 A | 9/2000 | Kemmler et al. |
| 6,147,498 A | 11/2000 | Sumiya et al. |
| 6,233,132 B1 | 5/2001 | Jenski |
| 6,236,947 B1 | 5/2001 | Dowling et al. |
| 6,260,004 B1 | 7/2001 | Hays et al. |
| 6,262,550 B1 | 7/2001 | Kliman et al. |
| 6,262,620 B1 | 7/2001 | Jenski et al. |
| 6,326,898 B1 | 12/2001 | O'Leyar et al. |
| 6,718,222 B2 * | 4/2004 | Bergo et al. ................. 700/117 |
| 6,731,126 B2 * | 5/2004 | Plummer ..................... 324/765 |

\* cited by examiner

Primary Examiner—Ernest Karlsen
(74) Attorney, Agent, or Firm—Randall M. Heald; Gary Borda; Guy Miller

(57) ABSTRACT

16 Claims, 5 Drawing Sheets

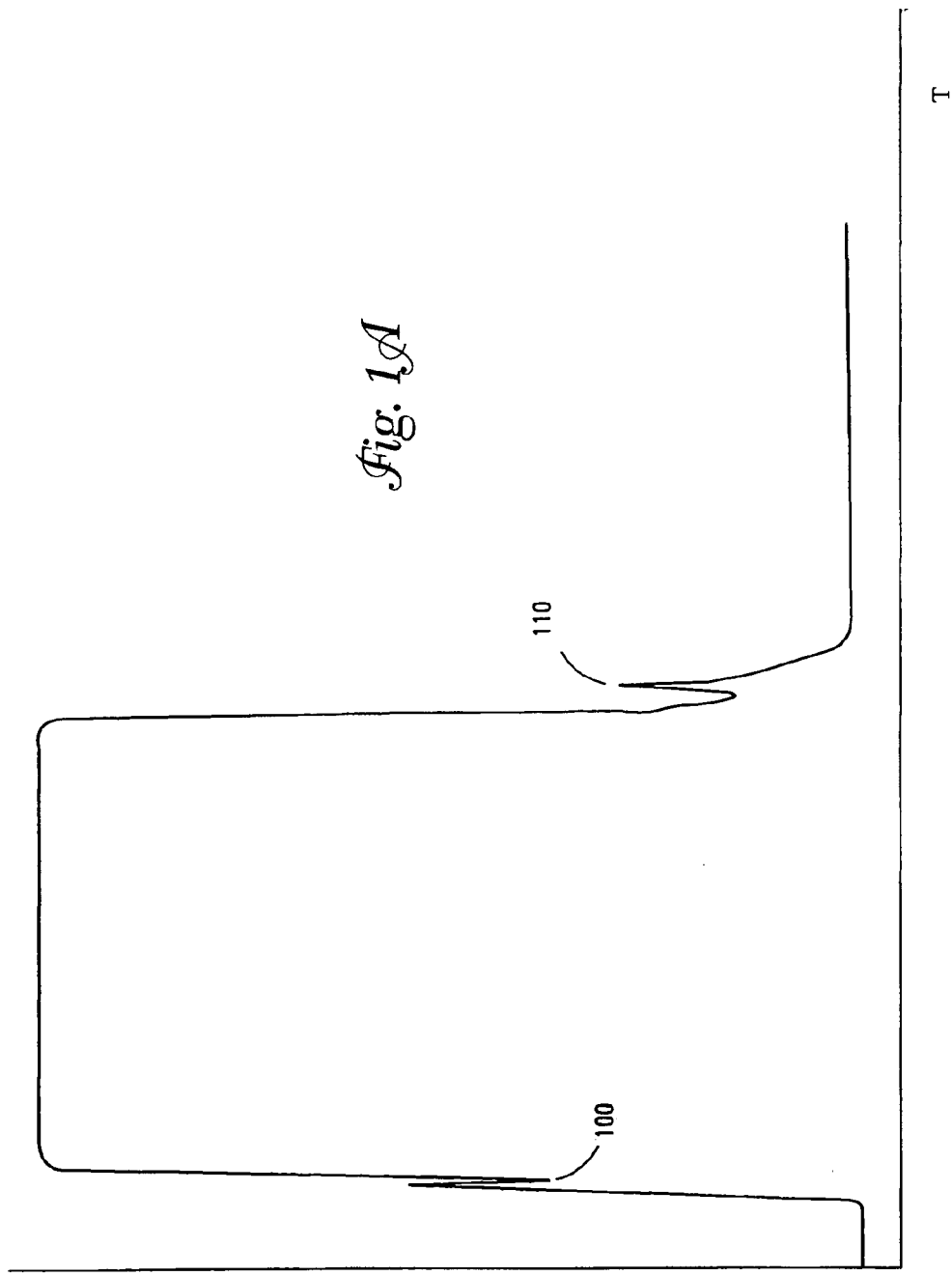

CURRENT SIGNATURE SENSOR

CROSS-REFERENCE TO RELATED APPLICATION

This application claims benefit under 35 U.S.C. §119(e) of U.S. Provisional Application Ser. No. 60/318,095, filed Sep. 7, 2001, which is incorporated herein by reference.

JOINT GOVERNMENT EMPLOYEE AND SMALL BUSINESS OR NONPROFIT CONTRACTOR INVENTIONS

The invention described herein was made in the performance of work under NASA contract and by employees of the United States Government and is subject to the provisions of Public Law 96-517 (35 U.S.C. §202) and may be manufactured and used by or for the Government for governmental purposes without the payment of any royalties thereon or therefore. In accordance with 35 U.S.C. §202, the contractor elected not to retain title.

FIELD OF THE INVENTION

The present invention relates generally to current signature sensors and in particular the present invention relates to monitoring electrical current in solenoid valves.

BACKGROUND OF THE INVENTION

Health of electromechanical systems and specifically of solenoid valves is a primary concern of the Space Shuttle program. The potential of delaying scheduled launch of vehicles and/or personnel injury due to failure of electromechanical systems requires the program to continuously disassemble, inspect and test Ground Support Equipment valves and flight systems valves to assure their readiness. Furthermore, disassembly inspection and testing of these systems pose an additional potential risk of hardware failure.

Flow Control Valves (FCV) are part of a flight system which requires extensive monitoring and testing. At the present time, ground systems using current measuring techniques are utilized to perform these tests. Performances of these tests have to be scheduled during the Space Shuttle processing operations. They are a one-time monitoring process, not a continuous process.

There is a need to incorporate monitoring devices in flight systems to be able to continuously monitor the health and performance of these valves during real operating conditions. It is very advantageous to the program to detect degradation and/or potential problems before they happen. This will not only provide a safer operation but will save funding spent on unnecessary inspections.

Solenoid valve status indicators are often based upon microswitches that work by physically contacting a valve's poppet assembly. Movement of the poppet serves to move the microswitch. This movement, in turn, physically opens and closes the electrical switch that is connected to a remote monitoring system that functions to indicate the valve status. All of the physical contact and movement tends to be very unreliable and is subject to wear and tear of the assemblies, friction, breakage of the switch, and even leakage of the fluid (gas or liquid) in the valve. Historically, the performance of the microswitches is so poor and costly that many solenoid valve systems elect to forgo monitoring performance of the valve. Instead, these systems rely on costly maintenance service to check and periodically replace the microswitches/valves.

U.S. Pat. No. 6,326,898 issued Dec. 4, 2001 describes a solenoid plunger position detection algorithm that allows a technician to determine if a plunger of a solenoid completes a pre-determined travel length. A measured transition time of the solenoid (monitoring the actuation current) is compared to a predetermined data or average of several solenoids. The slope of current versus time is used to identify the initial and final times of the transition. As such, U.S. Pat. No. 6,326,898 provides an indication of performance against average values, but does not provide an indication of the health of a solenoid.

For the reasons stated above, and for other reasons stated below which will become apparent to those skilled in the art upon reading and understanding the present specification, there is a need in the art to accurately monitor the current health and predict the potential failure of solenoids.

SUMMARY OF THE INVENTION

The above-mentioned problems with monitoring the health of solenoids and other problems are addressed by the present invention and will be understood by reading and studying the following specification.

In one embodiment, a method for insitu determining the health and performance of a solenoid valve comprises processing an electrical current signature of the solenoid valve. Wherein processing the electrical current signature comprises monitoring peaks and valleys of an electrical current of the solenoid valve and recording a time corresponding to each of the peaks and valleys, and recording the slopes and magnitudes of the electrical current. The method further comprises comparing the electrical current signature with a historical profile or a learned profile of the solenoid valve electrical current, and providing a notification when out of specification conditions are encountered based upon the comparison.

BRIEF DESCRIPTION OF THE DRAWINGS

FIGS. 1A and 1B illustrate graphs of solenoid operating currents;

DETAILED DESCRIPTION OF THE DRAWINGS

Figure 1B:
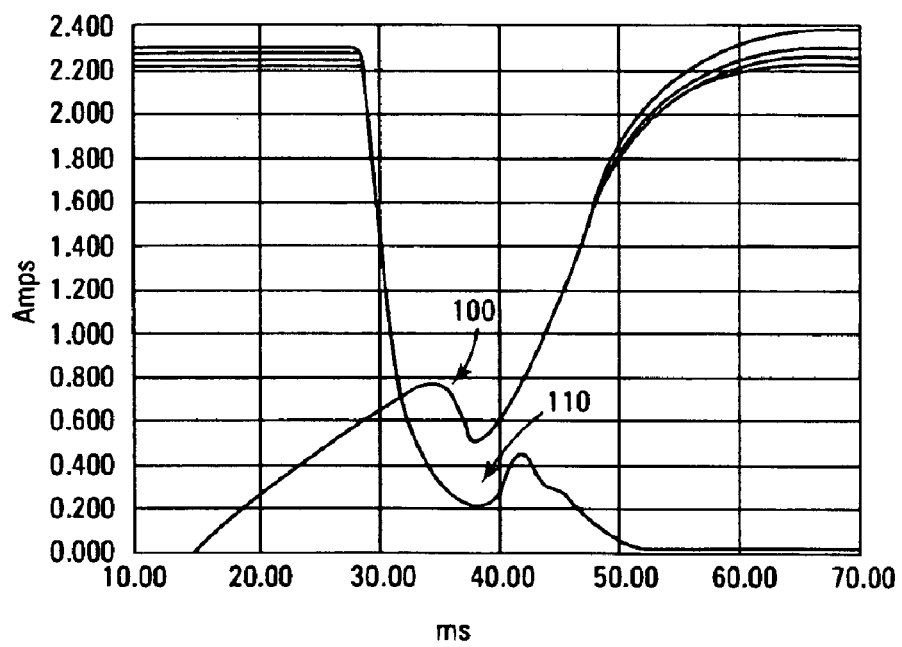

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Investigations into ways of extending or even eliminating periodic maintenance of solenoid valves has resulted in the ability to determine a valve's electrical current signature.

From this, it has been determined that a monitoring system can report on the operating characteristic or "health" of the solenoid and help determine when a specific valve might need servicing or even replacement.

The present invention is directed to a smart current signature sensor (SCSS) that measures the magnetic field generated by the electrical current in solenoid valves. The sensor's design achieves its goals in a non-invasive manner. The sensor continuously processes the measured current to provide information about the valve's health and performance. The sensor is capable of detecting degradation or potential failures. Although the present embodiment of the SCSS uses a hall effect sensor to measure the magnetic field generated by the electrical current to acquire the current signature of the solenoid valve, other sensing means like shunt bridges and precision resistors could be used by the system without performance degradation. The non-invasive characteristic of the system will be lost in this embodiment.

The smart current signature sensor monitors both steady state and "Turn On" and "Turn Off" transitions of the current signal in the solenoid. The solenoid's current presents unique characteristics (signatures), especially during these transitions, which have very characteristic peaks and valleys that repeat every operating cycle. They happen at very defined times and have a very defined current magnitude and shape. As electrical and/or mechanical degradation occurs in the solenoid valve, the signature changes both in time, magnitude, and shape, thus becoming a clear indication of degradation or potential problems.

An embodiment of a current signature sensor design of the present invention includes a self-contained, non-invasive smart sensor for valve health monitoring and failure prediction. Real-time continuous compensation is provided for magnet sensor technology related to offset and sensitivity (gain) drifts due to temperature variations (design corrects automatically output error due to environmental temperature changes). Valve Health Monitoring (VHM) and trending analysis can be performed by way of current signature processing. An algorithm including the first order derivative of the time domain current signature was developed. Peaks and valleys (signatures) of the current signal are detected and time-tagged. Additionally, slopes and current magnitudes are recorded. As explained below, these points give an accurate representation of the valve behavior and the condition of its mechanical and electrical components.

Electrical and/or mechanical degradation, and performance verification are accomplished by the monitoring system. Software algorithms running in the system check valve performance, compared to a nominal valve behavior, and notify a user when out of specification conditions are encountered.

Prior to describing the present invention in greater detail a description of the problem addressed may be helpful. During a process to identify areas of improvements in the Space Shuttle, it was desired to monitor the health of the Space Shuttle Main Engine (SSME) Flow Control Valve (FCV) and to predict potential problems. It was desired to have a totally non-invasive sensor that would monitor the desired parameter (in this case, current) without becoming a part of the system and thus not adding an additional failure point. Further, it was desired to not only monitor the parameter but to be able to draw conclusions based on this measurement and predict the functionality and health of the device. Ultimately, to predict a failure before it happens.

The most commonly monitored parameters in a solenoid valve like the one identified above are voltage and current. The solenoid temperature, although not normally monitored, also gives useful information regarding the health of the system. Current flowing through the solenoid valve and supply voltage characterize its electrical parameters. Since the preferred embodiment of the system is a non-invasive system, the magnetic field generated by the solenoid's electrical current is the primary parameter monitored in the present invention. Some examples of problems that have direct influence on the valve's current magnitude and shape are, variations in coil impedance due to coil degradation or partial short-circuit of the winding, and mechanical degradation of the moving components of the valve due to foreign objects intrusion or misalignment of the components. Solenoid internal valve temperature also provides additional indication of the solenoid operation and health. That is, an increase on the power dissipation raises the valve temperature accordingly.

As mentioned above, monitoring of the current signature of a solenoid provides an indication of the health of the unit. By performing current signature monitoring, the steady state electrical current value of the solenoid in the "ON" and "OFF" states and the "TURN ON" and "TURN OFF" transition areas are monitored. Electrical current versus time is monitored to identify unique characteristics (signatures) of the solenoid, specifically during these transitions.

Shuttle Operations periodically perform testing of the FCV during ground operations and have recorded current signatures for many of the solenoids installed in each of the vehicles. There is an extensive database documenting the FCV current signatures. This operation is done manually (labor-intensive process) on the ground during hardware processing. It is highly desirable to monitor these currents during actual flight operating conditions (real operating conditions) as well as to automate the monitoring process during ground operations.

The data gathered during ground operations shows that each Flow Control Valve (FCV) monitored has a very defined current signature. It also shows that the current signature is very repeatable. A mechanical or electrical anomaly in the FCV solenoid valve is reflected with a change in the current signature trace associated to it. FIGS. 1A and 1B shows typical current signatures for a valve. FIG. 1A is a smoothed current curve illustrating turn-on 100 and turn-off 110 shapes. FIG. 1B focuses on the transition locations for a flow control valve LV56 S/N CRP 1006 in the Space Shuttle Main Propulsion System (MPS) installed in OV-103 orbiter during STS-96 missions. As shown in FIG. 1B, the "TURN ON" 100 and "TURN OFF" 110 transitions for each of these current signatures have very characteristic peaks and valleys that repeat every cycle. They happen at a very defined times and have very defined current magnitude. As electrical/mechanical degradation occurs in the solenoid valve, these peaks and valleys change both in time and magnitude, thus becoming clear indicators of potential problems.

Figure 2:
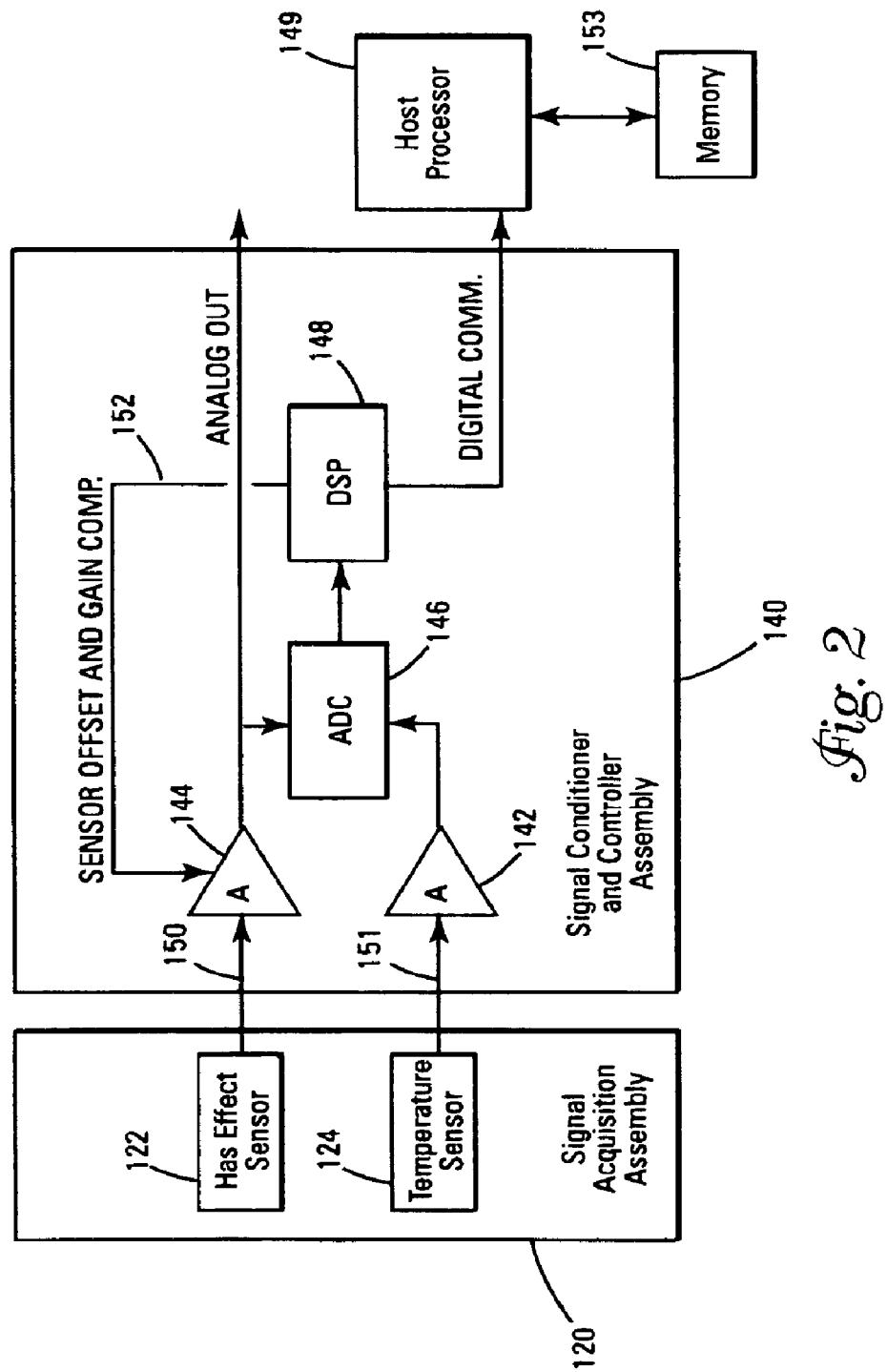
FIG. 2 is a block diagram of an embodiment of a valve health monitoring system of the present invention.

The hardware portion of the current signature sensor is composed of a signal acquisition assembly 120 and a signal conditioner and controller assembly 140, as shown in FIG. 2. The signal acquisition assembly contains a magnetic sensor 122 and a temperature sensor 124. As explained below, in one embodiment it also contains a flux concentrator as well as a shielding cage for the magnetic sensor. The magnetic sensor selected in one embodiment is a linear Hall Effect sensor manufactured by Allegro MicroSystems, Inc. This sensor was selected because of its electrical performance and small size.

The magnetic sensor and temperature sensor are processed by the signal conditioner and controller assembly 140. The assembly includes analog conditioners (signal amplifiers, offset and gain error correction circuits, and electrical noise filters) 142 and 144 to process the magnetic sensor output 150 and the temperature sensor output 151, respectively. An analog to digital converter (ADC) 146 prepares the signals for digital signal processor (DSP)148. A DSP is the preferred imbodiment for a controller. A controller could also be a micro-processor or a micro-controller. The DSP adjusts the magnetic sensor output with a feedback signal 152 to conditioner 144. The DSP also processes the magnetic sensor signals as explained below. An external processor 149 and memory 153 can be used to process, display, and store the valve current profiles for user's future use.

Figure 3:
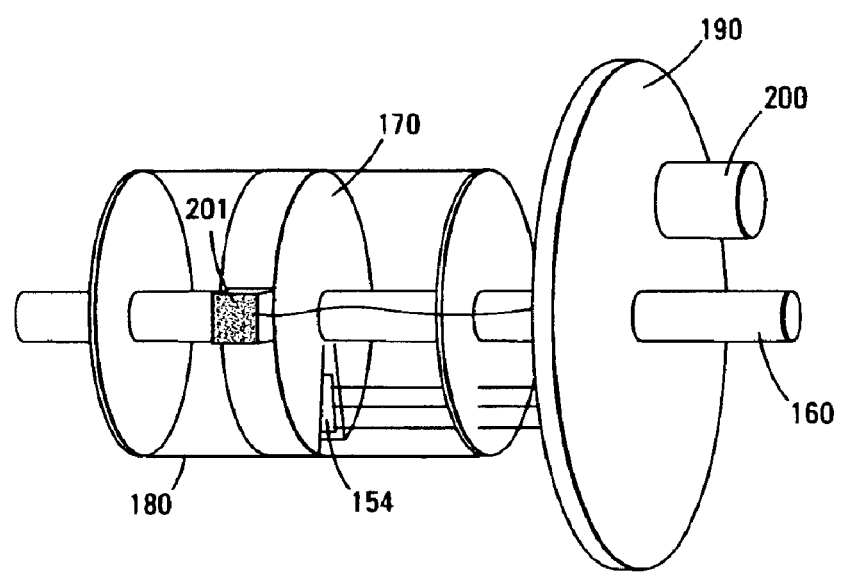
FIG. 3 illustrates an embodiment of a valve health monitoring system of the present invention.

The Hall effect sensor 122 translates the magnetic field, caused by the current conducted by the solenoid, into an electrical signal. Orientation of the surrounding magnetic field with respect to the sensing area inside the Hall Effect sensor is required to obtain maximum performance. The output voltage developed by the sensor is linearly proportional to the surrounding magnetic field until the sensor reaches saturation. Referring to FIG. 3, an illustration of an embodiment of a signal acquisition assembly is provided. The signal acquisition assembly is located around a current conducting wire 160 of a valve device (not shown), such as the positive power supply. A Hall effect sensor 154 is located within a flux concentrator 170. That is, in order to maximize the concentration of magnetic field (flux) through the Hall effect sensing area, a flux concentrator is used. The flux concentrator can be fabricated out of mild steel. To prevent unwanted external magnetic fields interacting with the field to be measured, a shielding cage 180 is utilized around the sensor/concentrator assembly.

The Hall effect sensor is coupled to a circuit board 190 that can contain the controller circuitry 140 of FIG. 2 (not in the present preferred embodiment). The temperature sensor 200 inside the signal acquisition assembly is used to perform offset and sensitivity (gain) drift compensation of the Hall effect sensor due to temperature. Due to the extreme variations in environmental temperature experienced during a Shuttle Mission, temperature compensation of the magnetic sensor is required to achieve the desired accuracy for this measurement. The temperature sensor selected in this preferred embodiment is a precision integrated circuit temperature sensor manufactured by National Semiconductors. This sensor provides a voltage output that is directly related to temperature (in degree Kelvin). It was also selected because of its performance and small size.

The signal conditioner and controller assembly is responsible for converting the low-level raw signal coming out of the signal acquisition assembly into a signal that is suitable to the user. The following are some of the functions that the signal conditioner and controller assembly are capable of performing. Converting a low-level raw signal from the signal acquisition assembly into a manageable level (0 to 5 Vdc output for a 0 to 5 amps input current). Automatically compensating, in real-time, the current sensor assembly offset and gain drifts due to temperature effects. Performing real-time calibration verification of the magnetic sensor either performed automatically or commanded by the system user. This is executed using a calibration coil 201 (FIG. 3) coupled to provide a known magnetic field through the flux concentrator. Performing real-time current signature analysis and trend analysis, and informing a user if functional degradation of the valve has occurred or a failure exists in the valve.

As stated above, a temperature sensor has been included in the signal acquisition assembly that provides the system with continuous monitoring of the assembly temperature. Calibration sessions at various temperatures are performed to characterize the Hall effect sensor drifts versus temperature with known inputs. A compensation curve is then calculated and programmed in the DSP for real-time adjustments of these parameters. Digital controlled potentiometers can be used in the pre-amplification stage and final amplification stage to compensate for any variations in the system response over temperature.

The DSP controller module is responsible for several tasks. First, it contains the information required to perform continuous real-time temperature compensation of the signal acquisition assembly to assure good measurement accuracy. The DSP calculates the required compensation and sets the digital potentiometers in the analog module to adjust the offset and gain settings. Secondly, it performs real-time current signature analysis and trending. Every valve cycle is monitored and health parameters are calculated to verify valve performance is within the nominal parameters. A more detail explanation of how this is performed is provided below. Additionally, the controller is capable of performing current signature learning. When this capability is performed by the DSP, the system is connected to a nominal valve. Cycling this solenoid valve ON and OFF provides the system with current signature examples of a nominal valve behavior. Parameter extraction is performed and stored by the controller to be used as a template for comparison when the system is operational to determine valve behavior.

Digital communication (RS-232) is also provided in the DSP controller module. It serves to perform sensor calibration, command and control, and low sampling rate signal acquisition. The system can be designed in a modular manner and tailored to any application. A real-time calibration module incorporates the calibration coil 201 as part of the signal acquisition assembly. The calibration module, commanded by the DSP controller module or by the user, performs a calibration verification cycle of the system to verify performance of the current signature sensor has not degraded.

Valve health analysis and failure prediction are performed using software algorithms residing in the DSP controller module. The system analyzes the current signature signal provided by the signal acquisition assembly/analog module. Information about specific characteristics (features) of the current signature signal is extracted from the analog signal and compared against stored information of the solenoid valve behavior. The comparisons performed are graded as nominal, borderline or failure. An account of these results is stored as well as forwarded to the user for further action.

As explained above, investigations into ways of extending or even eliminating periodic maintenance has revealed that a monitoring system can report general valve "health" and indicate when a specific valve might need servicing or even replacement to avoid failure. In particular, software running in a DSP can analyze the incoming data (recorded valve current signature) and determine the state of the valve whether it is energized, de-energized, or in a transitioning state. It is noted that primarily during the transition phase the software identifies key features in the current signature and is thus able to determine the "health" of the valve.

The software can be used to identify the following features: the time the value begins to transition, the time of maximum change in current in-rush or out-rush, the time poppet movement begins, the amplitude of the current required to initiate poppet movement, the time required for the poppet to travel to and seat in its final position, the time the energizing current reaches steady state, the amplitude of the energizing current, the minimum required holding current before the poppet unseats, and the time required for the poppet to unseat. From the data collected in monitoring these features, a determination can be made regarding the general operating characteristics, i.e., health, of the valve. Potential problems that may be identified during the monitoring process may be impeded operation such as jammed poppet travel, burnt or shorted windings in the solenoid, friction build-up in the valve, faulty valve spring, incorrect operating voltage or temperature or pressure, bounce during the poppet seating process, and failure of anti-arcing circuitry.

In one embodiment of the present invention, a valve's current signature is continuously sampled at about 10K samples per second with 10 bits of digital resolution. Each new sample is communicated to the controller. The software running on the controller performs a number of functions including: buffering, filtering, feature identification and extraction, and general valve health assessment. The buffered data is filtered with a 117-coefficient (tap) finite impulse response (FIR) filter modeled after a 500 Hz low-pass Bessel filter. The Bessel filter was chosen because it has a very gradual transition band in the frequency domain that minimizes artificially inserted ringing in the time domain while reducing noise in the signal.

Feature identification may be accomplished by locating peaks, valleys and zero crossings of a difference filter output of the signal. The difference filter is computed by subtracting consecutive data points. When the valve is fully energized or de-energized, the difference filter output will fluctuate rapidly around zero. Ideally, the output would be equal to zero, but noise will cause the signal to fluctuate. When the valve begins to energize, the difference filter output will tend to have a strong positive departure from fluctuating around zero. The output rises to peak at the maximum rate of current in-rush and then gradually drops as the magnetic field in the solenoid builds-up. The difference signal will cross zero when the poppet valve movement begins and continue to drop as the magnetic field pushes the poppet against the spring. The second zero crossing will occur when the poppet seats into its final position. The difference filter output continues to rise as the magnetic field strengthens in holding force.

As the magnetic field nears its maximum holding force, the difference filter output will gradually drop and return to fluctuating around zero. The valve is now fully energized at a steady state. During the de-energizing transition, the difference filter output will have a strong negative departure from fluctuating around zero. The output continues to drop until a maximum rate of magnetic field collapse is reached. The output heads back toward zero and crosses zero when the poppet unseats and is pushed back by its spring. The difference filter output crosses zero again when the valve returns to the de-energized state and then slowly rises back to fluctuating around zero as the magnetic energy stored in the valve completely dissipates.

The software starts a counter when a zero crossing in the difference filter output is detected. When a valve state transition is detected by the strong departure from fluctuating around zero, the software records valve parameters corresponding to the signal amplitude and time of the following peaks, valleys, and zero crossings that correspond to the features of interest. So long as the valve parameters are within predetermined tolerances, the valve is considered to be acceptably healthy. The valve parameters may also be supplied to a trained neural network which can identify anomalies such as impeded poppet travel, faulty spring, shorted solenoid coils, etc.

A simple algorithm-has been devised to detect the desired specific characteristics in the current signature signal. A first-order derivative of the time-domain signal is calculated real-time. Peaks and valleys of current signature signal are detected by time tagging the signal transitions from positive to negative and vice versa (zero-crossing transitions).

In operation, the system monitors the current signature signal to detect valve activation (energize or de-energize state), as well as to calculate a first derivative of the signal. As soon as valve actuation is detected, the system determines whether the valve is being energized or de-energized and starts a series of timers accordingly.

Figure 4:
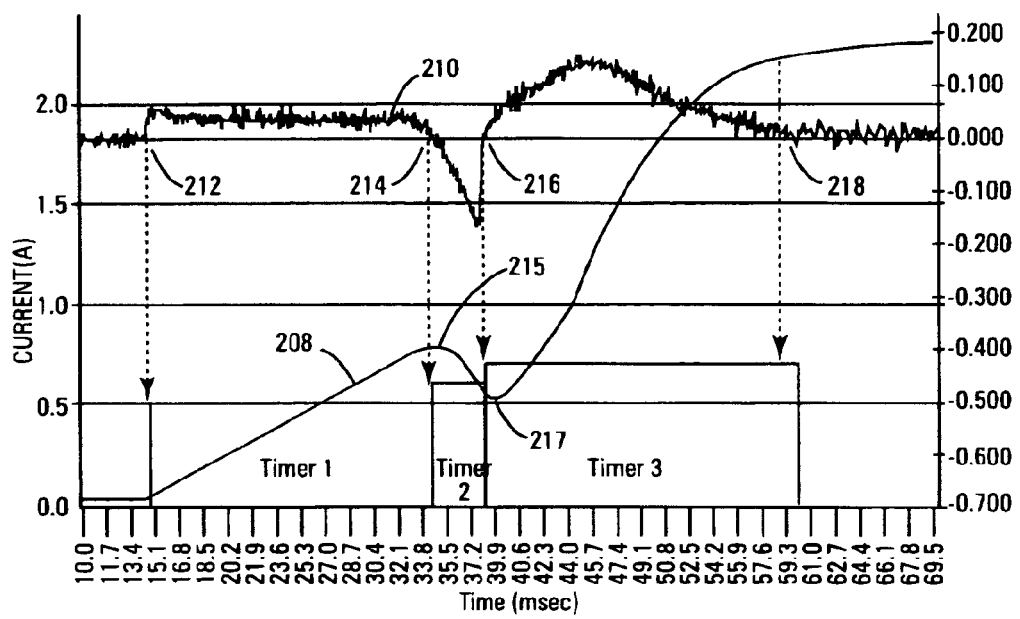
FIG. 4 is a graphical representation of the operation of an embodiment of a valve health monitoring system of the present invention.

Referring to Table I and FIG. 4, if the valve is being energized, the system calculates and records an average of the first derivative current magnitude 210 after valve actuation is detected 212 (valve current 208) but before the first zero crossing 214 is detected. By doing this, an average slope of the first transition is recorded. The system monitors the current signature first derivative to detect the first zero transition 214 of the signal. Once the transition is detected, the system time-stamps the event as well as records the magnitude of the current drawn by the valve at that instance. By doing this, the first peak 215 of the signature is defined. The system calculates and records an average of the current magnitude after the first zero crossing is detected but before the second zero crossing 216 is detected. By doing this, an average slope of the second transition is recorded.

TABLE 1

Sequence of Events for "TURN-ON" cycle.

| SEQ. # | Operation | Timer Action | Current Magnitude Action |
|---|---|---|---|
| S0 | Steady State No-Current | No Action | Sample and record current magnitude |
| S1 | Valve Activation Detected | Timer 1: Starts | $1^{st}$ derivative calculation starts |
| S2 | Transition before $1^{st}$ zero-crossing is detected | Timer 1: counts | Calculate $1^{st}$ derivative average magnitude and record (Slope1) |
| S3 | $1^{st}$ zero-crossing detected ($1^{st}$ peak detected) | Timer 1: stops and records Timer 2: starts | Current magnitude is recorded |
| S4 | Transition after $1^{st}$ zero-crossing but before $2^{nd}$ zero-crossing | Timer 2: counts | Calculate $1^{st}$ derivative average magnitude and record (Slope2) |
| S5 | $2^{nd}$ zero-crossing detected ($1^{st}$ valley detected) | Timer 2: stops and records Timer 3: starts | Current magnitude is recorded |
| S6 | Transition after $2^{nd}$ zero-crossing but before steady state Full-Current. | Timer 3: counts | Calculate $1^{st}$ derivative average magnitude and record (Slope3) |
| S7 | Steady State condition detected (reached) | Timer 3: stops and records | Current magnitude is recorded |
| S8 | Steady State Full-Current | No Action | Sample and record current magnitude $1^{st}$ derivative calculation stops |

The system monitors the current signature first derivative 210 to detect the second zero transition 216 of the signal. Once the transition is detected, the system time-stamps the event as well as records the magnitude of the current drawn by the valve at that instance. By doing this, the first valley 217 of the signature is defined. The system calculates and records the average of the current magnitude after the second zero crossing 216 is detected but before the steady state current 218 is detected. By doing this, an average slope of the third transition is recorded. Further, the system waits until a steady state operation of the valve is achieved and records the magnitude of the current.

Figure 5:
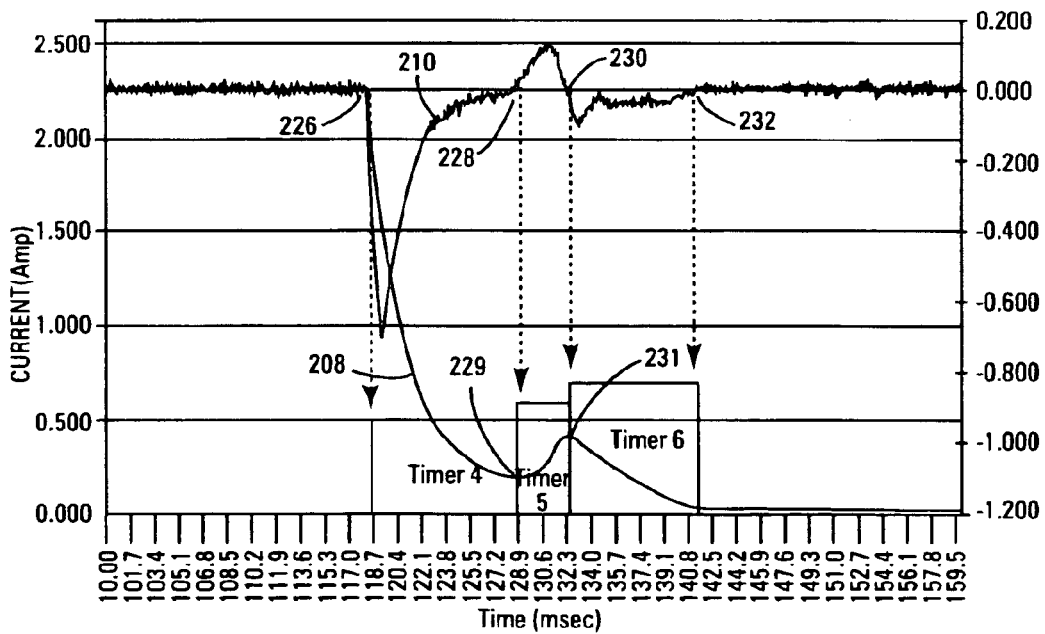
FIG. 5 is another graphical representation of the operation of an embodiment of a valve health monitoring system of the present invention.

Referring to Table 2 and FIG. 5, if the valve is de-energized the system calculates and records an average of the first derivative current magnitude 210 after valve de-actuation 226 is detected but before the first zero crossing 228 is detected. By doing this, an average slope of the first transition is recorded. The system monitors the current signature first derivative to detect the first zero transition 228 of the signal. Once the transition is detected, the system time-stamps the event as well as records the magnitude of the current drawn by the valve at that instance. By doing this, the first valley 229 of the signature is defined.

TABLE 2

Sequence of Events for "TURN-OFF" cycle.

| SEQ. No. | Operation | Timer Action | Current Magnitude Action |
|---|---|---|---|
| S9 | Steady State Full-Current | No Action | Sample and record current magnitude |
| S10 | Valve De-activation Detected | Timer 4: starts | $1^{st}$ derivative calculation starts |
| S11 | Transition before $1^{st}$ zero-crossing is detected | Timer 4: counts | Calculate $1^{st}$ derivative average magnitude and record (Slope4) |
| S12 | $1^{st}$ zero-crossing detected ($1^{st}$ valley detected) | Timer 4: stops and records Timer 5: starts | Current magnitude is recorded |
| S13 | Transition after $1^{st}$ zero-crossing but before $2^{nd}$ zero-crossing | Timer 5: counts | Calculate $1^{st}$ derivative average magnitude and record (Slope5) |
| S14 | $2^{nd}$ zero-crossing detected ($1^{st}$ peak detected) | Timer 5: stops and records Timer 6: starts | Current magnitude is recorded |
| S15 | Transition after $2^{nd}$ zero-crossing but before steady state No-Current | Timer 6: counts | Calculate $1^{st}$ derivative average magnitude and record (Slope6) |
| S16 | Steady State condition detected (reached) | Timer 6: stops and records | Current magnitude is recorded |
| S17 | Steady State No-Current | No Action | Sample and record current magnitude $1^{st}$ derivative calculation stops. |

The system then calculates and records an average of the current magnitude after the first zero crossing 228 is detected but before the second zero crossing 230 is detected. By doing this, an average slope of the second transition is recorded. The system monitors the current signature first derivative to detect the second zero transition 230 of the signal. Once the transition is detected, the system time-stamps the event as well as records the magnitude of the current drawn by the valve at that instance. By doing this, the first peak 231 of the signature is defined. The system calculates and records an average of the current magnitude after the second zero crossing 230 is detected but before the steady state no-current 232 is detected. By doing this, an average slope of the third transition is recorded. The system waits until a steady state operation of the valve is achieved and records the magnitude of the current.

The measured parameters are then compared to the ones contained in the system. An uncertainty range for each of these parameters is established to account for normal valve differences as well as measurement errors, and a decision is made whether the valve falls within what is considered nominal operation, or determines if a potential failure has been detected. Number of on/off valve cycles and statistics of nominal cycles, borderline cycles and failed cycles are recorded by the system to be downloaded by the user.

A benefit of embodiments of the present invention is the automatic identification of the features using a very small sample of the current signature. In contrast, most algorithms require that the entire current signature transition be recorded before data processing can begin, whereas an algorithm in the present invention works on each data point as the current signature is sampled. This both reduces the required memory capacity and provides a quicker answer (the features are identified and valve parameters are measured as the valve transitions, instead of first recording the entire transaction and then post processing the collected data).

Further, at the expense of minor amount of processing and memory capability, adding a minimum/maximum filter and a counter can enhance the difference filter. In this embodiment, the width of a sliding window used to find the local minimum and maximum values is specified. Anytime the min/max value changes, the counter is reset. When the counter reaches one less than the width, a peak is found by the max filter and valley is found by the min filter. These peaks and valleys correspond to the zero crossings in the difference filter output. The width of the sliding window is used to refine the filters' noise rejection. A wider window requires more memory and processing, but rejects more noise.

CONCLUSION

A solenoid health monitoring system has been described that uses analog circuitry and a controller. The preferred embodiment for a controller is a DSP. The analog circuitry is responsible for providing signal conditioning to the low-level raw signal coming from a signal acquisition assembly. Software running in a DSP analyzes the incoming data (recorded current signature) and determines the state of the solenoid whether it is energized, de-energized, or in a transitioning state. In one embodiment, the software identifies key features in the current signature during the transition phase and is able to determine the "health" of the solenoid.

Although specific embodiments have been illustrated and described herein, it will be appreciated by those of ordinary skill in the art that any arrangement, which is calculated to achieve the same purpose, may be substituted for the specific embodiment shown. For example, additional zero crossings (4 more after the $2^{nd}$ zero crossing) can also be monitored and recorded. This is helpful when determining the health of the valve especially in borderline cases. This application is intended to cover any adaptations or variations of the present invention. Therefore, it is manifestly intended that this invention be limited only by the claims and the equivalents thereof

What is claimed is:

1. A method for insitu determining the health and performance of a solenoid valve comprising:
   processing an electrical current signature of the solenoid valve comprising,
   monitoring peaks and valleys of an electrical current of the solenoid valve and recording a time corresponding to each of the peaks and valleys, and
   recording the slopes and magnitudes of the electrical current;

comparing the electrical current signature with a historical or learned profile of the solenoid valve electrical current; and providing a notification when out of specification conditions are encountered based upon the comparison.

2. The method of claim 1 wherein processing the electrical current signature of the solenoid valve comprises:

calculating and recording an average of a first derivative current magnitude after valve actuation is detected but before a first zero crossing is detected;

monitoring the first derivative to detect the first zero crossing;

recording a time-stamp of the first zero crossing and recording a magnitude of electrical current drawn by the valve at the time of the first zero crossing;

calculating and recording an average of the current magnitude after the first zero crossing is detected but before a second zero crossing is detected;

monitoring the first derivative to detect the second zero crossing;

recording a time-stamp of the second zero crossing and recording a magnitude of electrical current drawn by the valve at the time of the second zero crossing;

calculating and recording an average of the current magnitude after the second zero crossing is detected but before a steady state electrical current is detected; and recording a magnitude of an electrical current during steady state operation.

3. The method of claim 1 wherein the processing an electrical current signature of the solenoid valve comprises:

calculating and recording an average of a first derivative current magnitude after valve de-actuation is detected but before a first zero crossing is detected;

monitoring the first derivative to detect the first zero crossing;

recording a time-stamp of the first zero crossing and recording a magnitude of electrical current drawn by the valve at the time of the first zero crossing;

calculating and recording an average of the current magnitude after the first zero crossing is detected but before a second zero crossing is detected;

monitoring the first derivative to detect the second zero crossing;

recording a time-stamp of the second zero crossing and recording a magnitude of electrical current drawn by the valve at the time of the second zero crossing;

calculating and recording an average of the current magnitude after the second zero crossing is detected but before a steady state electrical no-current is detected; and recording a magnitude of an electrical current during steady state no-current operation.

4. The method of claim 1 further comprising:

grading the comparison as nominal, borderline or failure; and recording a number of operated cycles of the solenoid valve and a number of graded nominal, borderline and failed comparisons.

5. A monitoring system to determine a health of a solenoid valve comprising:

a signal acquisition assembly having a magnetic sensor to translate a magnetic field produced by the solenoid valve during operation around it into an electrical output voltage, wherein the magnetic field represents an operating current of the solenoid valve;

a signal conditioner for providing signal conditioning to an output signal of the signal acquisition unit; and a controller to perform real-time current signature analysis and trending of the conditioned output signal, wherein the controller monitors peaks and valleys of the conditioned output signal and records a time corresponding to each of the peaks and valleys, and records slopes and magnitudes of the conditioned output signal, the controller further compares the conditioned output voltage with a historical or learned profile of the solenoid valve, and provides a notification when out of specification conditions are encountered based upon the comparison.

6. The monitoring system of claim 5 wherein the signal conditioner comprises:

a temperature sensor, wherein the signal conditioner compensates the magnetic sensor output in response to the temperature sensor.

7. The monitoring system of claim 6 wherein the magnetic sensor is a linear Hall Effect sensor.

8. The monitoring system of claim 6 further comprises:

a flux concentrator to concentrate the magnetic field on the magnetic sensor; and shielding to block externally produced magnetic fields.

9. The monitoring system of claim 6 wherein the controller grades the comparison as nominal borderline or failure, and records a number of operated cycles of the solenoid valve and a number of graded nominal, borderline and failed comparisons.

10. The monitoring system of claim 6 wherein the controller calculates an average of a first derivative magnitude of the magnetic sensor output after the solenoid valve is actuated but before a first zero crossing is detected, the controller monitors the first derivative to detect the first zero crossing and records a time-stamp of the first zero crossing and a corresponding magnitude of the magnetic sensor output.

11. The monitoring system of claim 10 wherein the controller calculates an average of the magnetic sensor output magnitude after the first zero crossing is detected but before a second zero crossing is detected, and monitors the first derivative to detect the second zero crossing, the controller records a time-stamp of the second zero crossing and a corresponding magnitude of the magnetic sensor output.

12. The monitoring system of claim 11 wherein the controller calculates an average of the current magnitude after the second zero crossing is detected but before a steady state electrical current is detected, and records a magnitude of the magnetic sensor output during steady state operation.

13. The monitoring system of claim 5 wherein the controller executes a software algorithm to perform current signature learning by connecting the monitoring system to a nominal valve, and cycling the nominal valve ON and OFF to obtain current signature examples of the nominal valve behavior, further parameter extraction is performed and stored by the controller to be used as a template for comparison with the solenoid valve.

14. The monitoring system of claim 6 wherein the controller calculates an average of a first derivative magnitude of the magnetic sensor output after the solenoid valve is de-actuated but before a first zero crossing is detected, the controller monitors the first derivative to detect the first zero crossing and records a time-stamp of the first zero crossing and a corresponding magnitude of the magnetic sensor output.

15. The monitoring system of claim 14 wherein the controller calculates an average of the magnetic sensor output magnitude after the first zero crossing is detected but before a second zero crossing is detected, and monitors the first derivative to detect the second zero crossing, the controller records a time-stamp of the second zero crossing and a corresponding magnitude of the magnetic sensor output.

16. The monitoring system of claim 15 wherein the controller calculates an average of the current magnitude after the second zero crossing is detected but before a steady state electrical no-current is detected, and records a magnitude of the magnetic sensor output during steady state operation.

* * * * *